United States Patent
Song et al.

(10) Patent No.: US 6,893,544 B2
(45) Date of Patent: May 17, 2005

(54) APPARATUS AND METHOD FOR DEPOSITING THIN FILMS ON A GLASS SUBSTRATE

(75) Inventors: Hee Soo Song, Gyeongsangbuk-do (KR); Sung Wan Park, Gyeongsangbuk-do (KR)

(73) Assignee: Samsung Corning Co., Ltd. (KR)

(*) Notice: Subject to any disclaimer, the term of this patent is extended or adjusted under 35 U.S.C. 154(b) by 113 days.

(21) Appl. No.: 10/219,980

(22) Filed: Aug. 14, 2002

(65) Prior Publication Data

US 2003/0033983 A1 Feb. 20, 2003

(30) Foreign Application Priority Data

Aug. 14, 2001 (KR) .................................... 2001-0048923
Aug. 21, 2001 (KR) .................................... 2001-0050179

(51) Int. Cl.[7] ............................................ C23C 14/34
(52) U.S. Cl. ..................... 204/298.25; 204/192.12; 204/298.23; 204/298.09
(58) Field of Search ................. 204/192.12, 298.09, 204/298.23, 298.25

(56) References Cited

U.S. PATENT DOCUMENTS 5,116,023 A * 5/1992 Contin ....................... 251/203
5,244,554 A * 9/1993 Yamagata et al. ........ 204/192.2
6,491,802 B2 * 12/2002 Ishikawa et al. ........ 204/298.25

* cited by examiner

*Primary Examiner*—Steven Versteeg
(74) *Attorney, Agent, or Firm*—Anderson Kill & Olick, PC (57) ABSTRACT

An in-line sputtering system for depositing a thin film on a substrate includes a buffer heating module, an entry transfer module adjacent to the buffer heating module and having an expedited conveyor device for moving the substrate therein and a first sputtering module for depositing the thin film on the substrate, which is adjacent to the entry transfer module. The entry transfer module serves as a buffer zone which mitigates fluctuations in temperature and pressure in the first sputtering module when the substrate is unloaded from the buffer heating module. The substrate in the entry transfer module is moved by the expedited conveyor device at a speed greater than that in the first sputtering module.

12 Claims, 10 Drawing Sheets

APPARATUS AND METHOD FOR DEPOSITING THIN FILMS ON A GLASS SUBSTRATE

FIELD OF THE INVENTION

The present invention relates to an in-line sputtering system used in depositing a thin film on a substrate; and, more particularly, to an in-line sputtering system continuously depositing thin films on a plurality of glass substrates wherein deposition uniformity and consistency for the substrates are improved.

BACKGROUND OF THE INVENTION

Sputtering techniques have been generally applied to a thin film deposition process in the course of fabricating a semiconductor, an LCD (Liquid Crystal Display), a PDP (Plasma Display Panel), a projection TV and the like. The sputtering techniques can be categorized into three types, i.e., an in-line type, a batch type, and an inter-back type, depending on its method of loading and unloading.

In the batch sputtering technique, a substrate is directly loaded into a coating chamber, whereas in the inter-back sputtering technique, a sub-chamber is used. In the in-line sputtering technique, the loading and unloading of the substrate into and from the coating chamber is aided by a loading chamber and an unloading chamber. Further a $SiO_2$ (silica) film and an ITO (Indium Tin Oxide) film are deposited on a surface of the glass substrate in sequence.

A conventional in-line sputtering system includes an entry load-lock module, which changes the interior pressure from atmospheric one to vacuum or vice versa, a buffer heating module for heating the glass substrate, a first sputtering module for depositing a silica film on the glass substrate, a heating module for heating the glass substrate, a second sputtering module for depositing an ITO film on the glass substrate, a buffer cooling module for cooling the glass substrate, and an exit load-lock module, which changes the interior pressure from vacuum to atmospheric one or vice versa.

Each of the modules accommodates a pair of the glass substrates held by a tray. Therefore, a processed substrate must be loaded into the next processing module in sequence before a new substrate can be loaded. While loading the new substrate, the processing condition in the module is disturbed. Hence the processing condition such as pressure needs to be re-adjusted prior to processing the substrate. Only after the processing conditions have been established in the processing module can the processing begin. As a result, under the conventional in-line sputtering system, a continuous sputtering process cannot be achieved.

The re-adjusting process further aggravates the processing outcome, during which time a drastic change in pressure occurs. In particular, when a substrate is loaded into the first sputtering module from the buffer heating module and into the second sputtering module from the heating module, such drastic change in pressure occurs. Respective base pressures of the first and the second sputtering module need to be established lower than those of the buffer heating module and the heating module, respectively, to take account of a rise in pressure when argon gas is supplied therein during the sputtering process. For example, after the substrate is unloaded from the buffer heating module, wherein the interior is maintained at a pressure ranging from $3 \times 10^{-2}$ to $5 \times 10^{-2}$ Torr, it is loaded into the first sputtering module, at which time it is exposed to the base pressure of approximately $10^{-6}$ Torr. Consequently the drastic change in pressure yields high rate of defect. Following the sputtering process, the base pressure rises to the processing pressure of approximately $2 \times 10^{-3}$ Torr. The same issue of drastic change in pressure is raised during the second sputtering process, however its detailed description is omitted for the sake of simplicity. The defects that occur on the substrate inevitably affect the quality of silica and the ITO films deposited thereon. Thus the conventional system yields a high rate of defective film deposition.

In the conventional system, the cooling takes place in a single module, specifically in the buffer cooling module. In other words, the processed substrate in the second sputtering module, at approximately 320° C., undergoes forced cooling in the buffer cooling module in a temperature ranging from 100 to 150° C. Consequently, a deterioration of the silica and the ITO films deposited on the substrate occurs due to a high thermal contraction.

Finally, the hinge design of an opening panel in the conventional system does not provide a sufficient amount of workspace while performing maintenance.

Accordingly, development has been pursued for a new in-line sputtering technique capable of providing a continuous and reliable film deposition process to further reduce or eliminate any form of defect due to a large and abrupt change in pressure or temperature.

SUMMARY OF THE INVENTION

It is, therefore, a primary object of the present invention to provide an in-line sputtering system that uniformly deposits a plurality of layers of thin film on a substrate providing deposition consistency for the substrates.

It is another object of the present invention to provide an in-line sputtering system that continuously deposits a thin film on a plurality of substrates.

It is still another object of the present invention to provide an in-line sputtering system to reduce the defects caused by a thermal contraction of the deposited layers of film on the substrate.

It is still another object of the present invention to provide an in-line sputtering system of which the chamber bodies are disengaged from each other to thereby provide an opening, i.e., workspace, therebetween, thereby facilitating maintenance and increasing reliability of the system.

In accordance with a preferred embodiment of the present invention, there is provided an in-line sputtering system for depositing a thin film on a substrate including; a buffer heating module in which an interior pressure is reduced to a state of vacuum and the substrate is preheated; an entry transfer module adjacent to the buffer heating module and having an expedited conveyor device for moving the substrate therein, in which the substrate is heated; and a first sputtering module for depositing the thin film on the substrate, which is adjacent to the entry transfer module, whereby the entry transfer module serves as a buffer zone which mitigates fluctuations in temperature and pressure in the first sputtering module when the substrate is unloaded from the buffer heating module, wherein the substrate in the entry transfer module is moved by the expedited conveyor device at a speed greater than that in the first sputtering module.

In accordance with another preferred embodiment of the present invention, there is provided an in-line sputtering system for depositing a thin film on a substrate, including: a sputtering module for coating the thin film on the substrate, which includes a coating chamber having a first coating chamber body and a second coating chamber body, wherein the chamber bodies have disengaging means for providing an opening therebetween.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

An in-line sputtering system in accordance with a preferred embodiment of the present invention will now be described with reference to the drawings.

The in-line sputtering system of the present invention is installed in a clean room environment. Glass substrates are transferred from one module to another by a conveyor device. A pair of the glass substrates are placed vertically, planar surfaces thereof being parallel to the direction of the transfer path.

Figure 1:
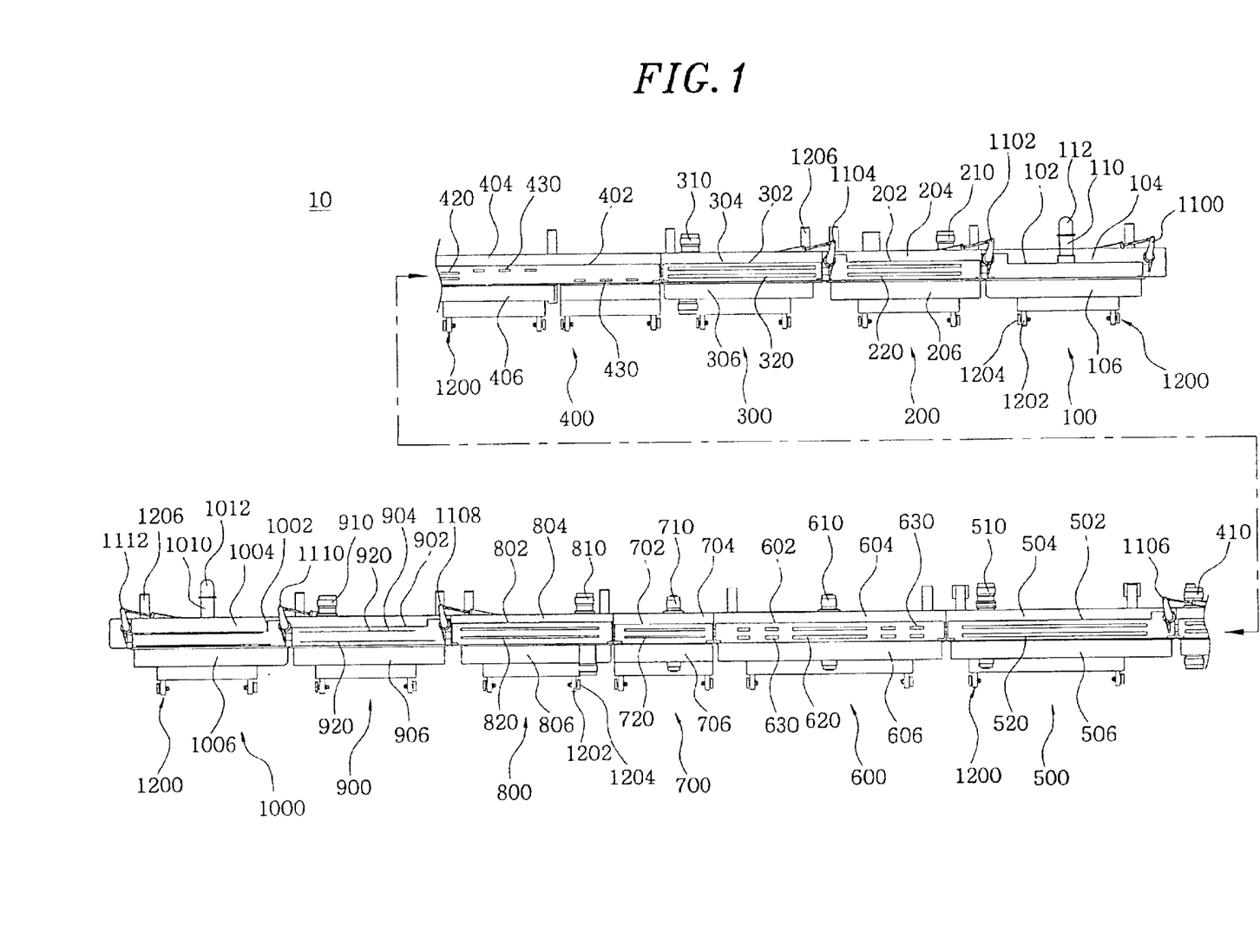
FIG. 1 is a top view of an in-line sputtering system in accordance with the present invention.
Figure 2:
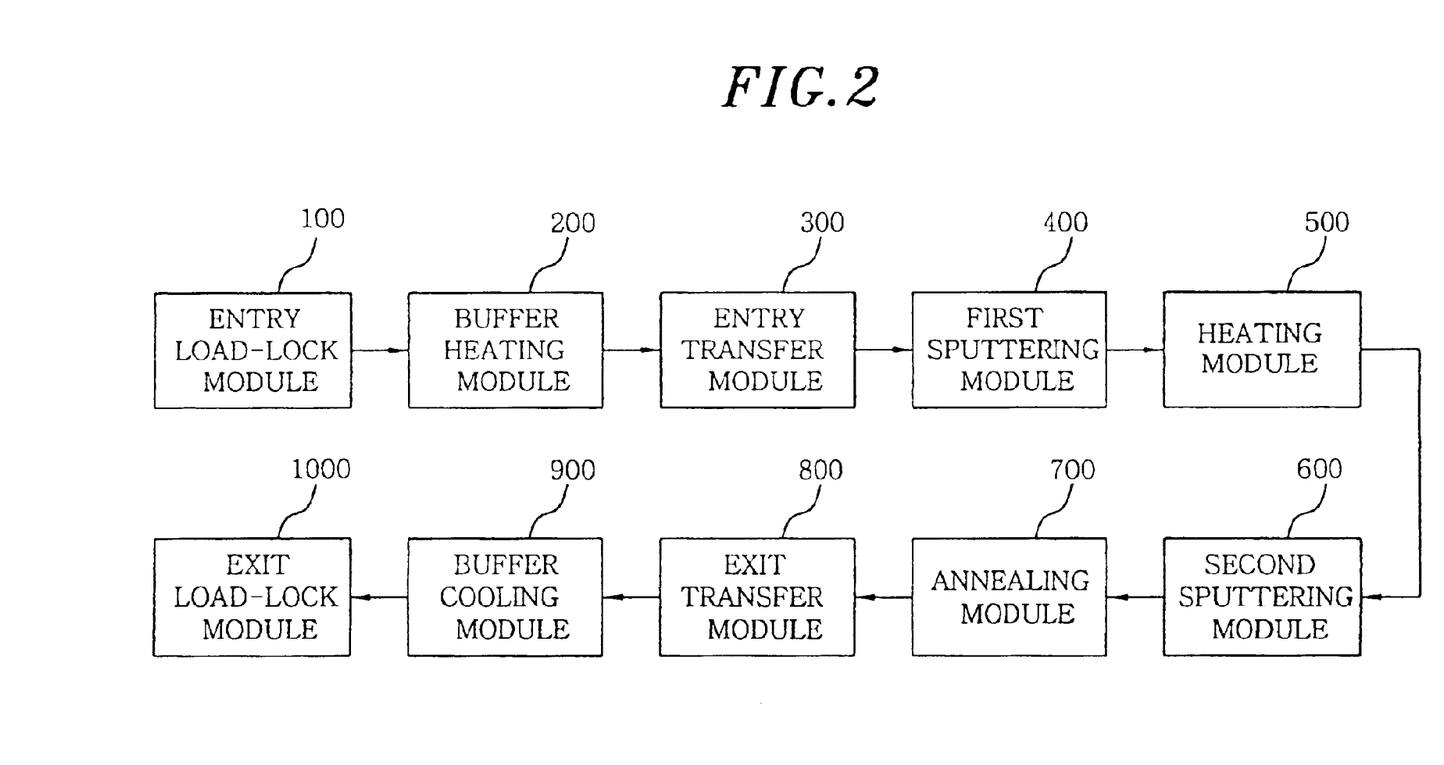
FIG. 2 sets forth a block diagram showing a processing sequence in accordance with the present invention.

Referring to FIGS. 1 and 2, the in-line sputtering system 10 of the present invention includes an entry load-lock module 100 having an entry load-lock chamber 102 therein, a buffer heating module 200 having a buffer heating chamber 202 therein, an entry transfer module 300 having an entry transfer chamber 302 therein, a first sputtering module 400 having a first coating chamber 402 therein, a heating module 500 having a heating chamber 502 therein, a second sputtering module 600 having a second coating chamber 602 therein, an annealing module 700 having an annealing chamber 702 therein, an exit transfer module 800 having an exit transfer chamber 802 therein, a buffer cooling module 900 having a buffer cooling chamber 902 therein and an exit load-lock module 1000 having an exit load-lock chamber 1002 therein, wherein all the modules 100, 200, 300, 400, 500, 600, 700, 800, 900, 1000 of the in-line sputtering system 10 are arranged in sequence.

Figure 5:
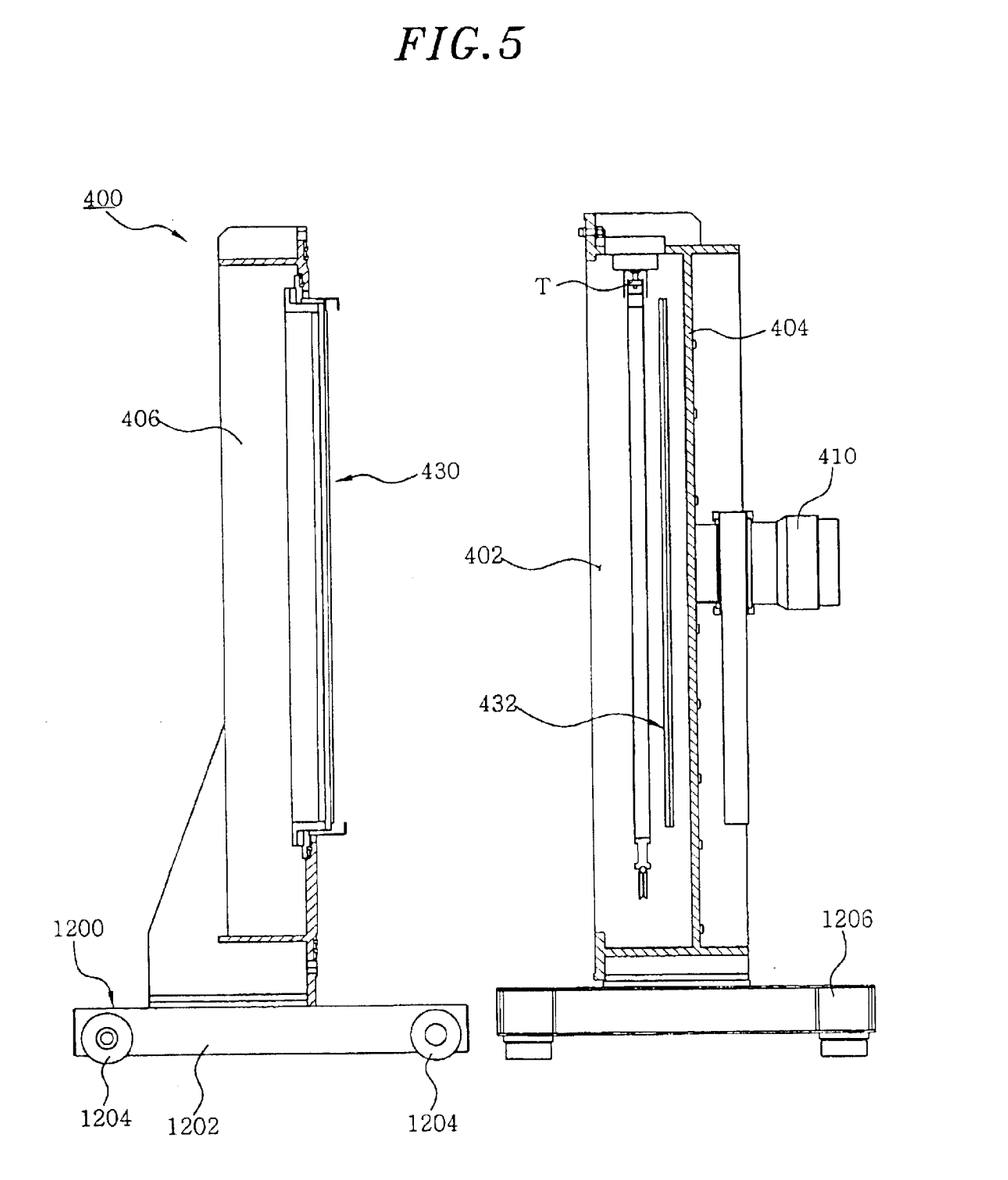
FIG. 5 illustrates a vertical cross-sectional view of the first sputtering module with a first coating chamber opened.

The chambers 102, 202, 302, 402, 502, 602, 702, 802, 902, 1002 are divided into two distinct bodies, first chamber bodies 104, 204, 304, 404, 504, 604, 704, 804, 904, 1004 and second chamber bodies 106, 206, 306, 406, 506, 606, 706, 806, 906, 1006, wherein each of the second chamber bodies 106, 206, 306, 406, 506, 606, 706, 806, 906, 1006 are able to disengage itself from the first chamber bodies 104, 204, 304, 404, 504, 604, 704, 804, 904, 1004 to thereby provide an opening between the chamber bodies in each of the modules 100, 200, 300, 400, 500, 600, 700, 800, 900, 1000 as shown in FIG. 5.

The interior pressure in each of the chambers 102, 202, 302, 402, 502, 602, 702, 802, 902, 1002 can be lowered to a desired vacuum level by employing corresponding vacuum pumps 110, 210, 310, 410, 510, 610, 710, 810, 910, 1010 respectively installed in the modules 100, 200, 300, 400, 500, 600, 700, 800, 900, 1000. The entry load-lock module 100 and the exit load-lock module 1000 further include vent valves 112, 1012, respectively, which can supply thereto or discharge therefrom atmospheric air.

Figure 3:
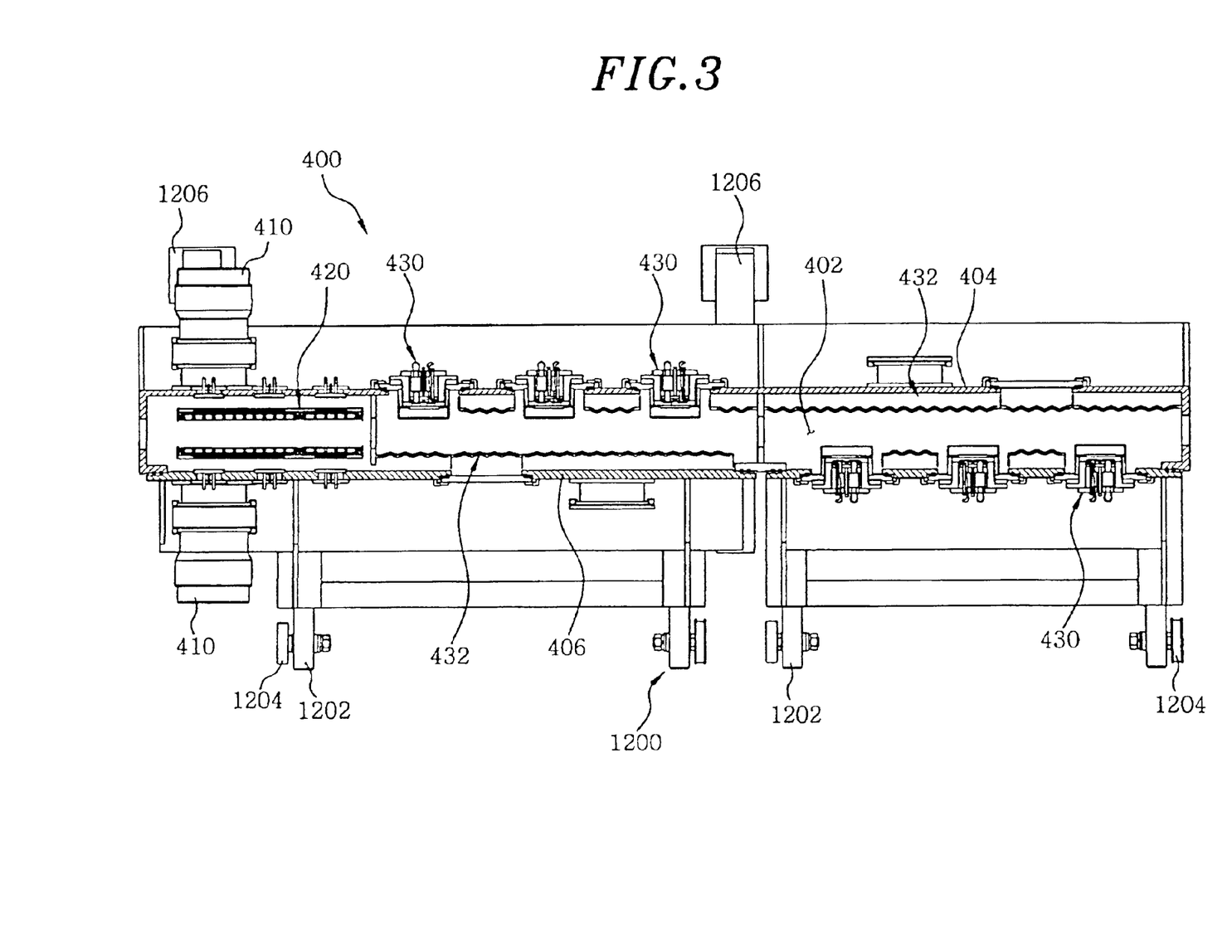
FIG. 3 presents a horizontal cross-sectional view of a first sputtering module of the in-line sputtering system in accordance with the present invention.
Figure 4:
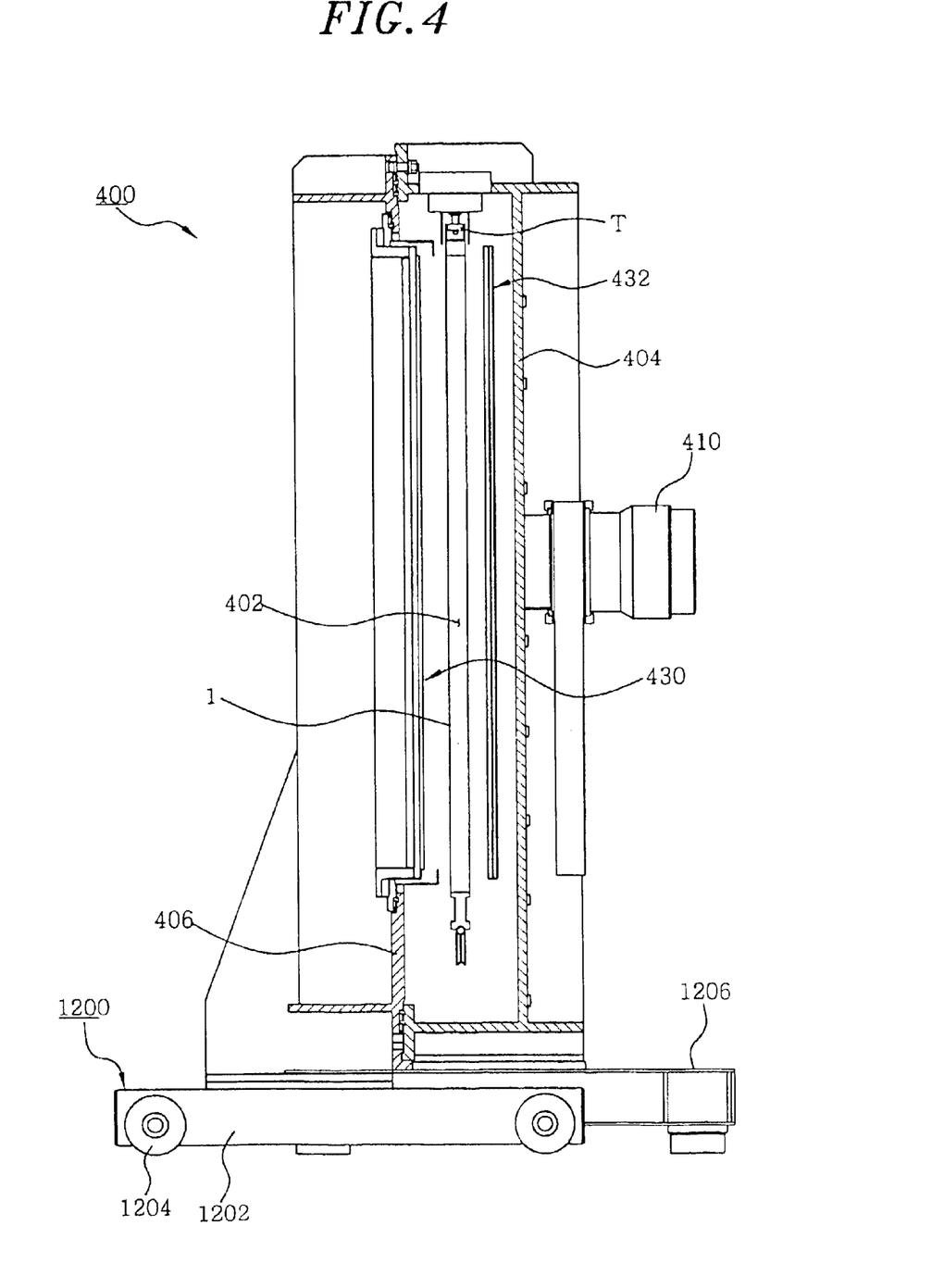
FIG. 4 describes a vertical cross-sectional view of the first sputtering module of the in-line sputtering system in accordance with the present invention.

The first sputtering module 400 is illustrated in FIGS. 3 to 5 (FIG. 3 shows a horizontal cross-sectional view thereof; FIG. 4, a vertical cross-sectional view thereof; and FIG. 5, a vertical cross-sectional view thereof with the entire second chamber body 406 disengaged from the first chamber body 404). In the first sputtering module 400, the second chamber body 406 serves as a lid of the first sputtering module 400, wherein the second chamber body 406 can be disengaged in a lateral direction to provide an opening therebetween as shown in FIG. 5.

A plurality of silica cathodes 430 for depositing the silica film, each equipped with a silica target and an electrode, are on each of the interior walls of the first and second chamber bodies 404, 406. As shown in FIG. 3, the cathodes 430 are evenly divided into the first and second chamber bodies. In the first chamber body 404, the cathodes 430 are placed in the second half of the chamber body 404 and in the second chamber body 406, they are placed in the first half of the chamber body 406, forming a diagonal arrangement between the two. Furthermore, in the first and second chamber bodies 404, 406, the portions that do not contain silica cathodes 430 are equipped with shield assemblies 432 to correspond to the opposing silica cathodes 430 in the other chamber body. The installment arrangement of the silica cathodes 430, including but not limited to the number and the placement of the silica cathodes 430, can be modified.

As described in FIG. 1, ITO cathodes 630, each having an ITO target and an electrode, are installed in the second sputtering module 600 for depositing the ITO film.

Each module in the system 10 has a conveyor device (not shown), which transfers a tray T holding a pair of the substrates 1 from one module to another. In the entry transfer module 300 and the exit transfer module 800, the expedited conveyor devices take on a higher speed, e.g., 5 m/min, than those of the modules 400, 500, 600, 700 in order to reduce the processing gap between the substrates in the first and the second sputtering module 400, 500 to about 5 mm.

In addition, the conveyor devices in the first and second sputtering modules 400, 600 have a multiple loading capability of the trays T. That is, a plurality of tray T, e.g., 5, can be loaded onto the conveyor device at one time.

Referring back to FIG. 1, the in-line sputtering system 10 includes a first gate valve 1100 for opening and closing the entry load-lock module 100 to load the glass substrate 1. A second gate valve 1102, located between the entry load-lock module 100 and the buffer heating module 200 is used to facilitate loading of the substrates 1 into the buffer heating module 200 from the entry load-lock module 100. A third gate valve 1104, placed between the buffer heating module 200 and entry transfer module 300 is used to facilitate loading and unloading of the substrates 1. A fifth gate valve 1108 is located between the exit transfer module 800 and the buffer cooling module 900 and acts to facilitate loading and unloading of the substrates 1. A sixth gate valve 1110 is placed between the buffer cooling module 900 and the exit load-lock module 1000, which acts to facilitate loading and unloading of the substrates 1. A seventh gate valve 1112 is placed in the downstream of the exit load-lock module 1000 and acts to facilitate unloading of the substrates 1.

The modules 400, 500, 600, 700 between the entry transfer module 300 and the exit transfer module 800 form a continuous path in the absence of the gate valves previously seen in the prior art. The pair of the substrates 1 unloaded from the entry transfer module 300 are directly loaded into the first sputtering module 400 for a continuous deposition of the silica film on the substrates 1 and are subjected to a following additional heating process, which takes place in the heating module 500. Thereafter, the heated substrate 1 is fed into the second sputtering module 600 where the ITO film is deposited on top of the silica film. Between the first sputtering module 400 and the heating module 500, there exists a fourth gate valve 1106, which is not used during the processing of substrates. It serves to ensure continuous processing of the substrates 1 in case of malfunctioning in any of the modules, to isolate the malfunctioning section so that the functional modules can keep functioning its normal processing. Further proceeding along the path, the processed substrate 1 in the second sputtering module 600 is directly loaded into the annealing module 700. Following the sequence, the processed substrate 1 in the annealing module 700 is directly loaded into the exit transfer module 800 where an expedited conveyor device promptly transfers the processed substrate 1 at about 5 m/min to the downstream of the exit transfer module, where it encounters the fifth gate valve 1108.

Combining the effects of the conveyor device described above with the absence of gate valves closing the transfer path of substrates between the entry transfer module 300 and the exit transfer module 800, a continuous sputtering process is achieved.

Figure 6:
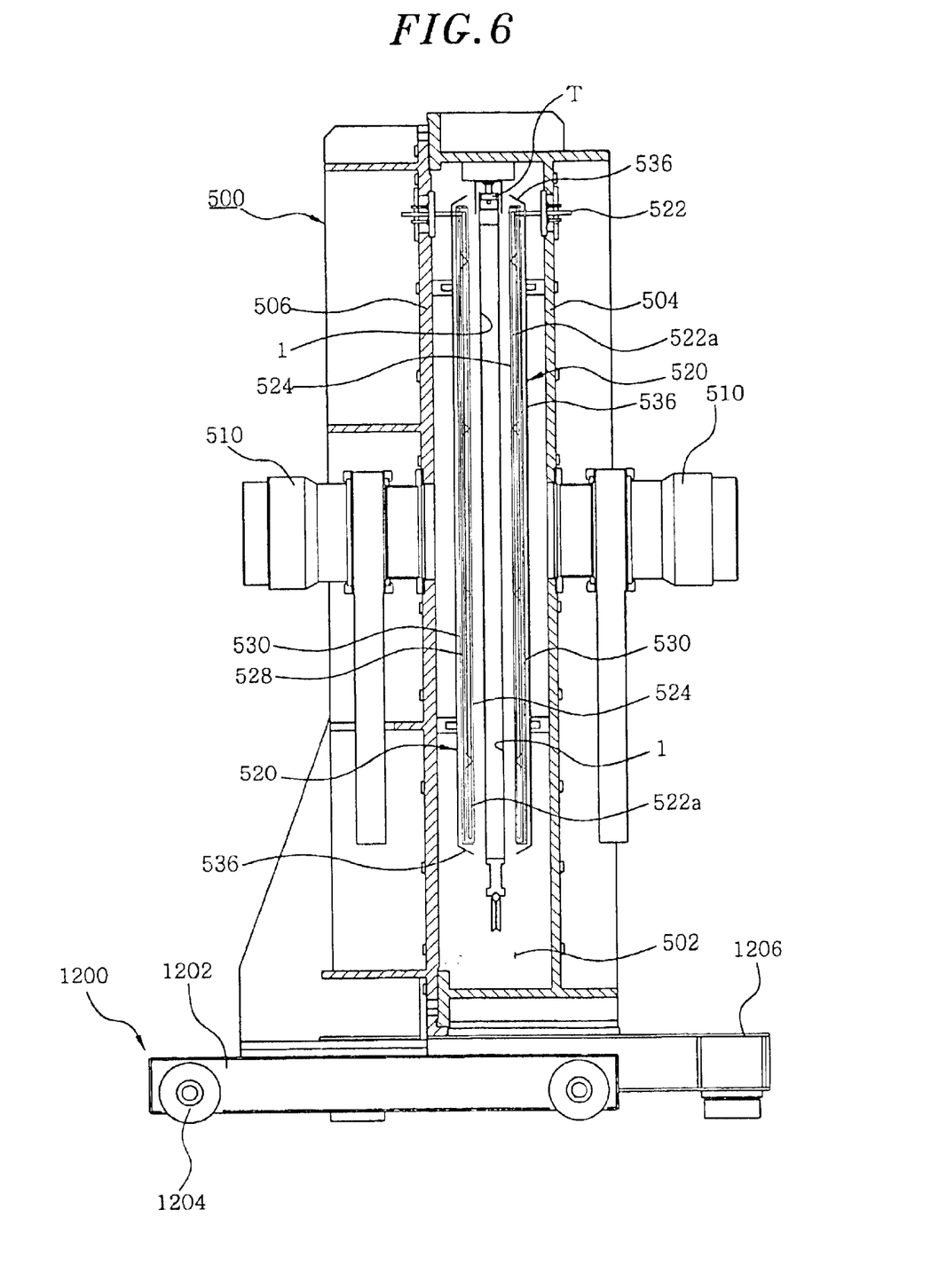
FIG. 6 offers a vertical cross-sectional view of the heating module of the in-line sputtering system in accordance with the present invention.
Figure 7:
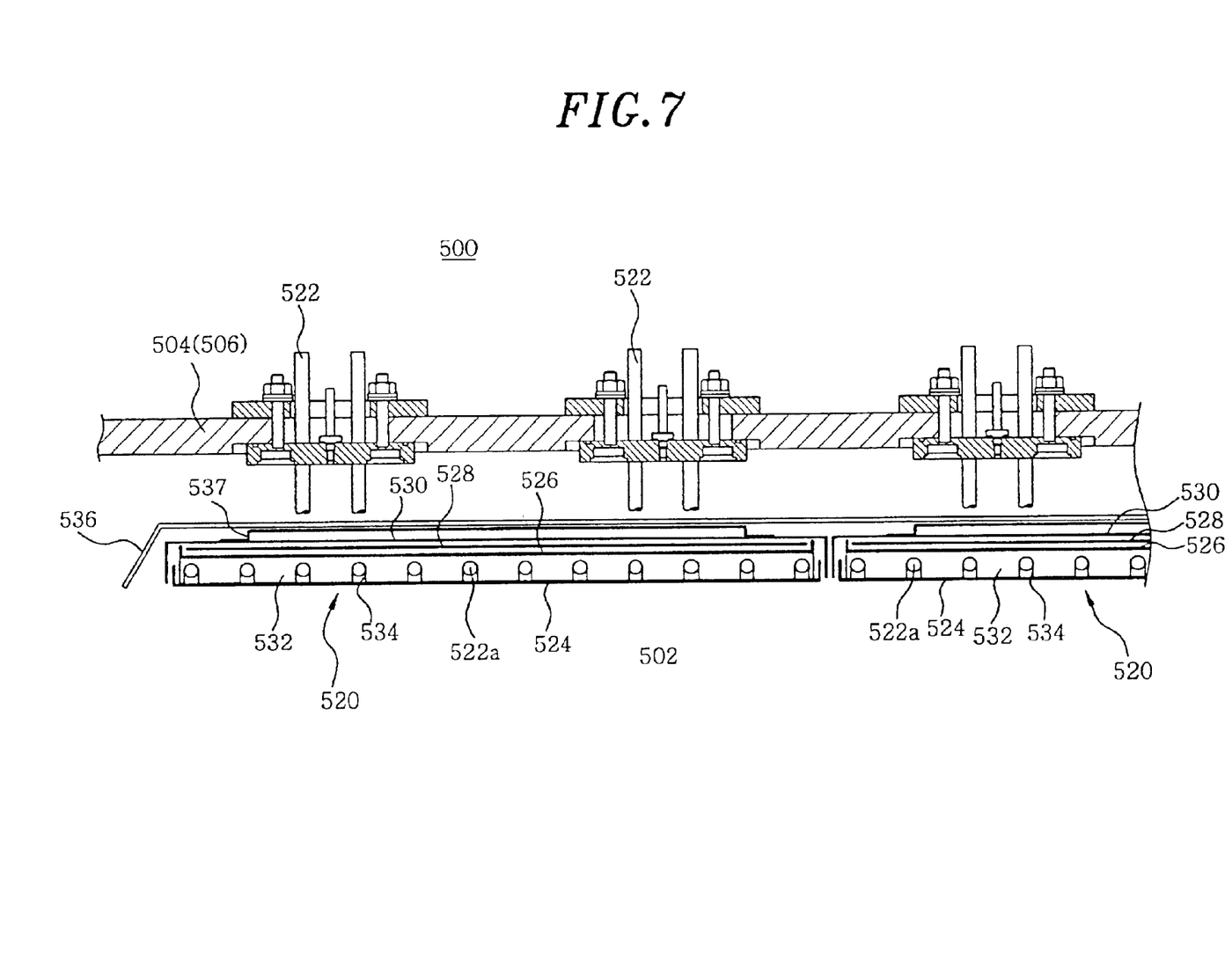
FIG. 7 depicts an enlarged horizontal cross-sectional view of a heating device of the heating module in accordance with the present invention.
Figure 8:
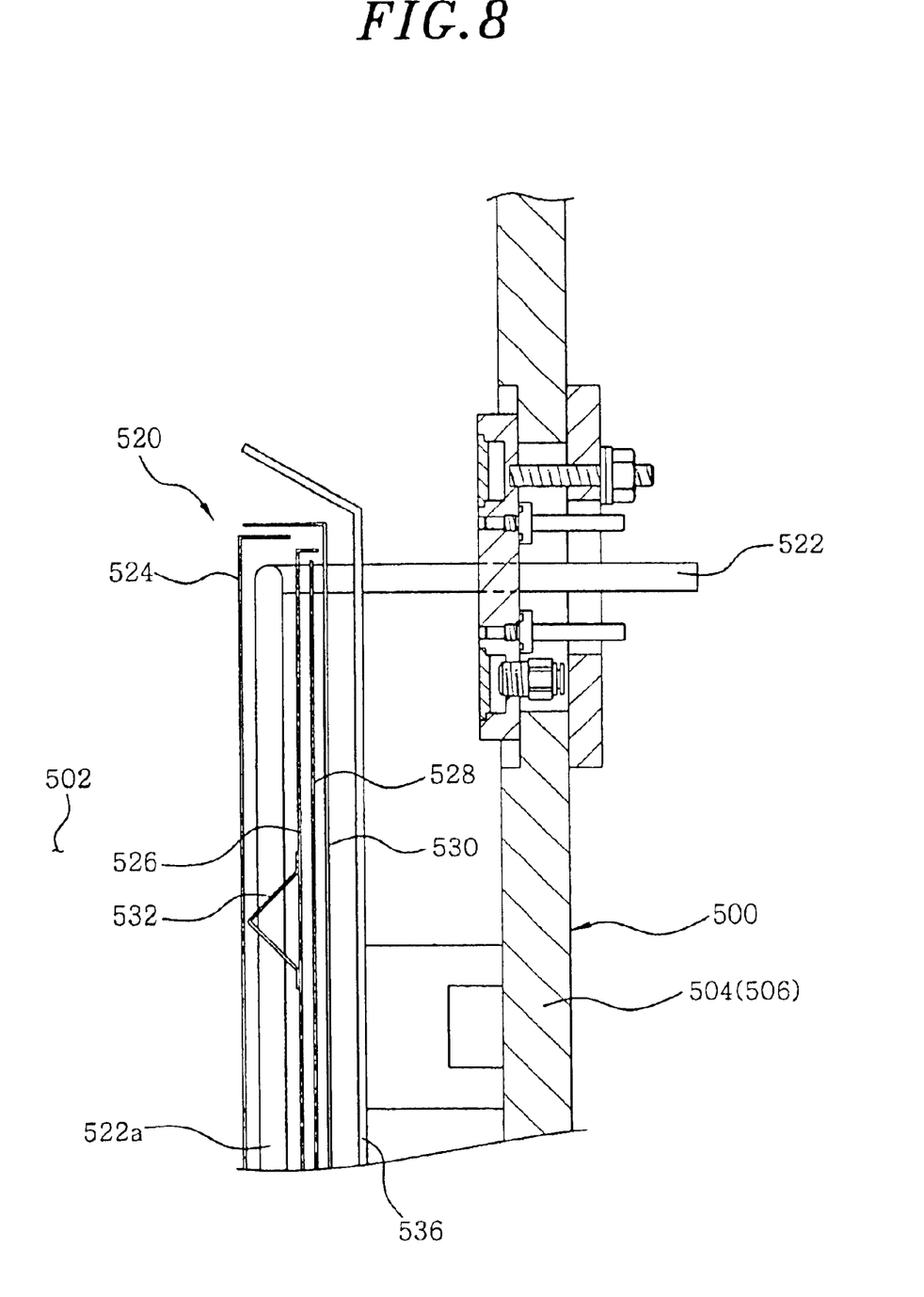
FIG. 8 represents an enlarged vertical cross-sectional view of the heating device of the heating module in accordance with the present invention.

As shown in FIGS. 6, 7, and 8, the heating device 520 includes a heat radiating pipe 522 having serpentine portions 522a parallel to the interior wall of the first and second chamber bodies 504, 506. A plurality of heat radiating plates 524 are used to provide uniform radiation of heat to the glass substrates 1 in the heating chamber 502, each being placed in front of the serpentine portion 522a of the heat radiator pipe 522. In addition, a plurality of first reflecting plates 526 are used to reflect the heat radiated from the serpentine portions 522a. A plurality of insulation plates 528 are used to prevent heat transfer, each being placed behind the first reflecting plate 526. In a similar fashion, a plurality of second reflecting plates 530 are used to reflect heat from the insulation plate 528 toward the first reflecting plate 526 located behind the insulation plate 528.

The serpentine portions 522a of the radiator pipe 522 are inserted in grooves 534 of holders 532 rigidly attached to the first reflecting plate 526. Each of the second reflecting plates 530 is rigidly attached to a shield 536 through a fixture 537, wherein the shields 536 are also rigidly attached to the first and second chamber bodies 504, 506.

The buffer heating module 200, the entry transfer module 300, the first sputtering module 400, the second sputtering module 600, the annealing module 700 and the exit transfer module 800 have heating devices 220, 320, 420, 620, 720, 820, respectively, which are similar to the heating device 520. Accordingly, the detailed description of the structure and operation thereof is omitted for the sake of simplicity.

Figure 9:
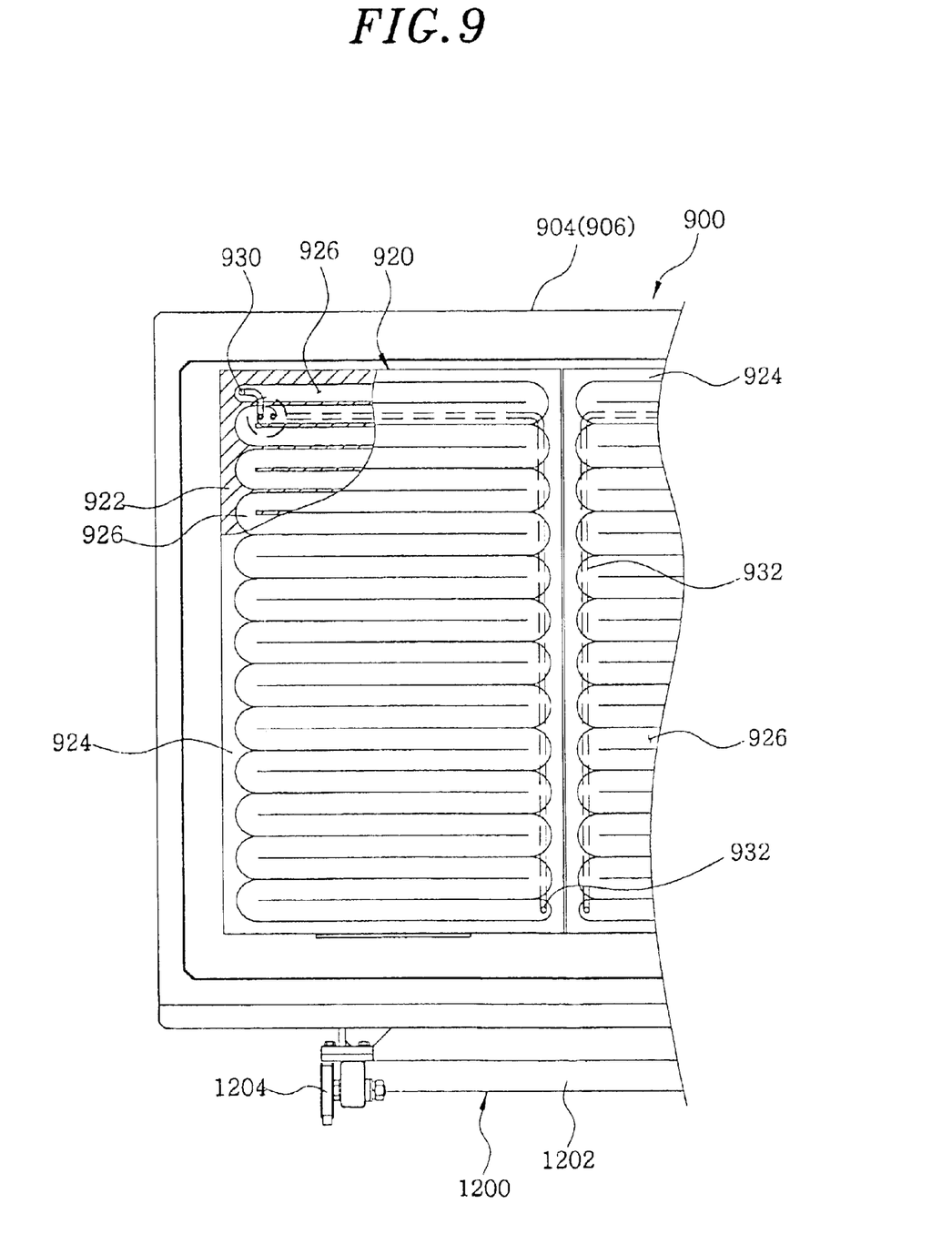
FIG. 9 illustrates a front view, partially broken away, of the cooling jacket in accordance with the present invention.
Figure 10:
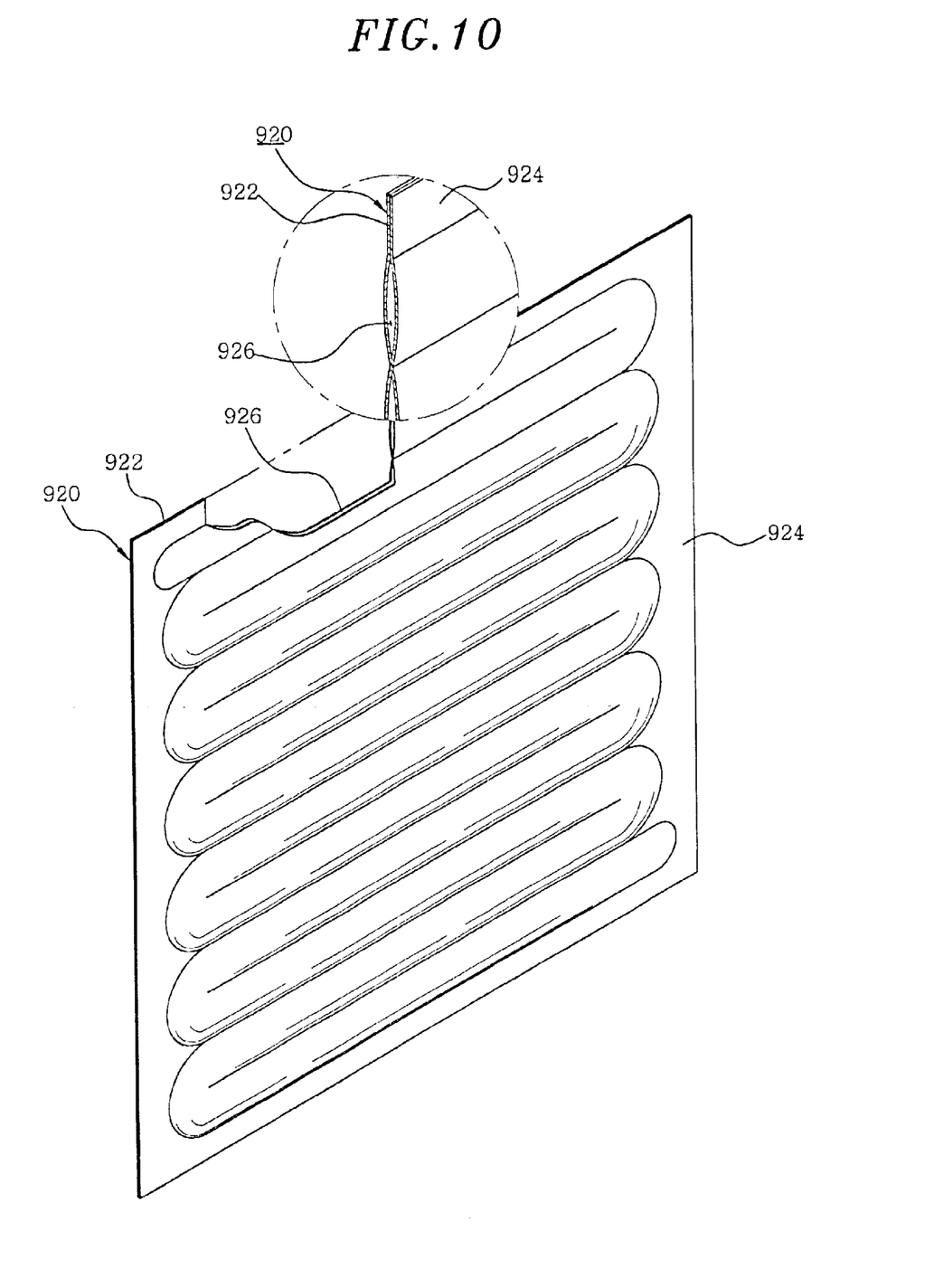
FIG. 10 provides a front perspective view, partially broken away, of the cooling jacket in accordance with the present invention.

There is shown a cooling jacket 920 installed in the cooling module 900 in FIGS. 9 and 10 (FIG. 9 illustrates a front view, partially broken away, of the cooling jacket 920 and FIG. 10 a front perspective view, partially broken away, of the cooling jacket 920). The cooling jacket 920 includes a first and a second plate 922, 924, each having a hollow serpentine portion. The first and second plates 922, 924 are joined together, so that their hollow serpentine portions form a serpentine cooling water channel 926 therein. One end of the water cooling channel 926 is connected to an inlet line 930 for supplying the cooling water and the other end thereof is connected to an outlet line 932 for discharging the cooling water, wherein the inlet line 930 and the outlet line 932 are connected to a well-known cooling water pump (not shown).

The cooling water is supplied to the cooling water channel 926 through the inlet line 930 by the cooling water pump after the glass substrate 1 having high temperature is loaded into the buffer cooling chamber 902 of the buffer cooling module 900. Then, the cooling water flows through the cooling water channel 926 to be discharged through the outlet line 932. While flowing through the cooling water channel 926, the cooling water absorbs heat from the buffer cooling chamber 902 and the glass substrate 1 through the first and the second plate 922, 924. Comparing the cooling jacket 920 to a conventional cooling pipe, the cooling jacket provides greater heat transfer area and greater volume of the cooling water contained therein. Accordingly, the cooling jacket 920 can cool the buffer cooling chamber 902 and the substrate 1 with higher efficiency.

Referring back to FIGS. 1, 3 to 6 and 9, there are shown wheel assemblies 1200, each of which is provided with a wheel frame 1202 and wheels 1204. The wheel assemblies are respectively attached to a corresponding one of the second chamber bodies 106, 206, 306, 406, 506, 606, 706, 806, 906, 1006, and are used in mobilizing the second chamber bodies 106, 206, 306, 406, 506, 606, 706, 806, 906, 1006 in the lateral direction to provide an opening between respectively corresponding first and second chamber bodies 104, 204, 304, 404, 504, 604, 704, 804, 904, 1004, 106, 206, 306, 406, 506, 606, 706, 806, 906, 1006, while each of the first chamber bodies 104, 204, 304, 504, 604, 704, 804, 904, 1004 is rigidly fixed to the system frame 1206. Accordingly, the maintenance of the chambers 102, 202, 302, 402, 502, 602, 702, 802, 902, 1002 can easily be carried out, thereby increasing the reliability of the system.

Operation of the in-line sputtering system 10 in accordance with the preferred embodiment of the present invention will now be described with reference to the drawings.

With reference to FIGS. 1 and 2, the interior pressure of the entry load-lock chamber 102 is changed from the state of vacuum to the atmospheric state. As the first gate valve 1100 opens, the glass substrate 1 is loaded into the entry load-lock module 100. After the substrate 1 is loaded into the entry load-lock module 100, the first gate valve 1100 closes and thereafter the interior pressure is changed from atmospheric one to vacuum. The second gate valve 1102 between the entry load-lock module 100 and the buffer heating module 200 is released as soon as the state of vacuum is reached in the entry lock-lock module 100, which allows the glass substrate 1 to be transferred from the entry load-lock module 100 to the buffer heating module 200. In the buffer heating module 200, the glass substrate 1 is heated by the heating device 220. The interior pressure of the buffer heating module 200 is maintained at a state of vacuum in the range from $3.0 \times 10^{-2}$ to $5.0 \times 10^{-2}$ Torr during the loading process of the substrate 1 into the entry load-lock module 100, and the second valve 1102 remains closed during such process. The glass substrate 1 is preheated in the buffer heating module 200 to about 100° C. After the substrate 1 is preheated, the third gate valve 1104 between the buffer heating module 200 and the entry transfer module 300 is opened and the substrate 1 is transferred into the entry transfer module 300. The substrate 1 is heated therein by the heating device 320 to about 150° C. By inserting the entry transfer module 300 between the buffer heating module 200 and the first sputtering module 400, the processing conditions in the first coating chamber 402 is not directly affected much by the loading and unloading of a substrate 1 in the buffer heating module 200. Thus the entry transfer module 300 functions as a buffer zone to mitigate a disturbance of the processing conditions in the first sputtering module 400 by maintaining a processing condition similar to that of the first sputtering module 400. Therefore the processing conditions in the first sputtering module 400 are substantially fixed, eliminating an abrupt change in pressure as was the case in the prior art when a substrate coming from a low vacuum state approximately $10^{-2}$ Torr is loaded into the first sputtering module in a high state of vacuum of approximately $10^{-6}$ Torr. Furthermore, the entry transfer chamber 302 is maintained at a pressure ranging from about $1.5 \times 10^{-3}$ to about $1.5 \times 10^{-2}$ Torr. If the interior pressure of the entry transfer module 300 exceeds about $1.5 \times 10^{-2}$ Torr, moisture is formed on the surface of the substrate 1, causing adhesive problems of the silica film on the substrate 1. On the other hand, if the interior pressure of the entry transfer module 300 falls below about $1.5 \times 10^{-3}$ Torr, the silica film hardens, thereby causing problems during the etching process of the silica film.

The base pressure of the first sputtering module 400 is established at $8 \times 10^{-6}$ Torr in the absence of argon gas. However, during the coating process wherein argon gas is supplied into the chamber 402, the pressure rises to $2 \times 10^{-3}$ Torr. Since the entry transfer module 300 is maintained at a pressure range close to the processing pressure in the first sputtering module 400, the substrate 1 loaded into the first sputtering module 400 is not exposed to a large and abrupt pressure change. While the pressure is held constant, the first sputtering module 400 can engage in a continuous processing of the substrates 1.

The silica film deposition process is performed as follows: a voltage with a high frequency of 13.56 MHz is applied to the silica cathodes 430 having the silica targets. Then plasma induced by a glow discharge of the silica cathodes 430 ionizes the inert gas, i.e., argon gas, and the ions of the inert gas come to bombard the silica target to thereby cause the atoms of the silica target to be sputtered. Subsequently, the substrate 1 is coated with the sputtered atoms. And in order to increase uniformity of the silica film coated on the glass substrate 1, the temperature of the substrate 1 is kept at about 250° C.

With reference to FIGS. 1 and 6, since the fourth gate valve 1106 between the first sputtering module 400 and the heating module 500 remains open during the thin film coating process, the substrate 1 processed in the first sputtering module 400 is directly loaded into the heating module 500.

The temperature of the substrate 1 in the heating module 500 is kept at about 300° C. The interior pressure of the heating chamber 502 is kept at about $2 \times 10^{-3}$ Torr by supplying Ar gas thereto, which is similar to that of the first coating chamber 402. The glass substrates 1 are further heated therein to have a uniform temperature distribution before the ITO film is coated thereon.

With reference to FIGS. 1 and 2, the substrates 1 are transferred from the heating module 500 to the second sputtering module 600 for depositing the ITO film. In order to improve the uniformity of the ITO film deposition, the temperature of the substrate 1 in the second coating chamber 602 is kept at about 320° C. The interior pressure of the second coating chamber 602 is maintained at about $2 \times 10^{-3}$ Torr by supplying argon or oxygen, wherein the base pressure of the second coating chamber 602 is established at about $8 \times 10^{-6}$ Torr.

The ITO film is coated on top of the silica film on the substrate 1 by performing a DC (direct current) sputtering process. In other words, a direct current of a high voltage is applied to the ITO cathodes 630 having the ITO targets, so that the glow discharge of the ITO cathodes 630 ionizes the inert gas. The ions of the inert gas come to bombard the ITO target, thereby causing the atoms of the ITO targets to be sputtered. The sputtered atoms coat over the silica film on the substrates 1.

The substrates 1 are transferred from the second sputtering module 600 to the annealing module 700. During the annealing process, the glass substrate 1 is heated in such a manner that the temperature of the heating device 720 in the annealing module 700 is higher than the temperature of the glass substrate 1 in the second sputtering module 600 by at least 10° C. For example, if the temperature of the glass substrate 1 during the ITO film coating process is 300° C., the temperature of the heating device 720 in the annealing module 700 is greater than or equal to 310° C. The interior pressure of the annealing module 700 is kept at about $2 \times 10^{-3}$ Torr. During which time, recovery and re-crystallization of the crystal grains in the silica film and the ITO film occurs.

After the completion of the annealing process, the glass substrates 1 are transferred from the annealing module 700 to the exit transfer module 800. In the exit transfer module 800 the glass substrates 1 are cooled down in the range from 150° C. to 200° C. while being heated by the heating device 820. In essence, the exit transfer module 800 reduces thermal contraction in the substrates, one of the primary causes of the defective films on the substrates in the conventional system. An interior pressure of the exit transfer module 800 is kept at about $5 \times 10^{-3}$ Torr and further providing a buffer zone similar to that of the entry transfer module 300, wherein the substrates 1 are transferred at a higher speed than in the annealing module 700.

With reference to FIGS. 1 and 9, the fifth gate valve 1108 between the exit transfer module 800 and the buffer cooling module 900 facilitates loading and unloading of the substrate 1. After opening the fifth gate valve 1108, the substrate 1 are loaded into the buffer cooling module 900 and cooled therein by the cooling jacket 920. The temperature of the buffer cooling module 900 where the forced cooling takes place is maintained at about 150° C. and the interior pressure thereof is kept at approximately $5.0 \times 10^{-3}$ Torr.

After completing the cooling process of the substrates 1, the sixth gate valve 1110 between the buffer cooling module 900 and the exit load-lock module 1000 is opened to load the substrate 1 into the exit load-lock module 1000. After the substrate 1 is loaded into the exit load-lock module 1000, the sixth gate valve 1110 closes. The vent valve 1012 of the exit load-lock module 1000 is then opened. Thereafter, the exit load-lock chamber 1002 reaches equilibrium of atmospheric pressure. Next, the seventh gate valve 1112 is opened and the glass substrate 1 is unloaded from the exit load-lock module 1000, meanwhile the buffer cooling module 900 remains in the state of vacuum. Thus unloading of the substrate 1 in the exit load-load module 1000 does not disrupt the cooling process in the buffer cooling chamber 902.

While the invention has been shown and described with respect to the preferred embodiments, it will be understood by those skilled in the art that various changes and modifications may be made without departing from the spirit and scope of the invention as defined in the following claims.

What is claimed is:

1. An in-line sputtering system for depositing a thin film on a substrate, comprising:
    a buffer heating module in which an interior pressure is reduced to a state of vacuum and the substrate is preheated;
    an entry transfer module adjacent to the buffer heating module and having an expedited conveyor device for moving the substrate therein, in which the substrate is heated;
    a first sputtering module for depositing the thin film on the substrate, which is adjacent to the entry transfer module,
    whereby the entry transfer module serves as a buffer zone which mitigates fluctuations in temperature and pressure in the first sputtering module when the substrate is unloaded from the buffer heating module,
    wherein the substrate in the entry transfer module is moved by the expedited conveyor device at a speed greater than that in the first sputtering module,
    a heating module adjacent to the first sputtering module;
    a second sputtering module adjacent to the heating module and having a heating device therein, in which a film layer is deposited on top of the thin film; and
    a gate valve installed between the first sputtering module and the heating module,
    wherein the gate valve is open while the substrate in the first sputtering module is coated with the thin film.

2. The in-line sputtering system of claim 1, wherein the first sputtering module includes means for maintaining a processing pressure and temperature therein.

3. The in-line sputtering system of claim 1, wherein the entry transfer module communicates with the first sputtering module while the substrate in the first sputtering module is coated with the thin film.

4. The in-line sputtering system of claim 1, wherein the entry transfer module further includes means for maintaining a pressure range from $1.5 \times 10^{-3}$ to $1.5 \times 10^{-2}$ Torr therein.

5. The in-line sputtering system of claim 1, further comprising an annealing module adjacent to the second sputtering module, in which the substrate coated with the film layer in the second sputtering module is heated to have a temperature higher than that of the heating device in the second sputtering module by about at least 10° C.

6. The in-line sputtering system of claim 5, further comprising an exit transfer module adjacent to the annealing module and having a second expedited conveyor device, wherein the substrate therein is moved by the second expedited conveyor device at a speed greater than that in the annealing module.

7. The in-line sputtering system of claim 6, wherein the substrate in the exit transfer module is cooled while being heated.

8. The in-line sputtering system of claim 6, further comprising a buffer cooling module for performing a forced cooling of the substrate therein, which is adjacent to the exit transfer module.

9. The in-line sputtering system of claim 8, wherein each of the modules includes a chamber having a first and a second chamber body.

10. The in-line sputtering system of claim 9, wherein the first and the second chamber body have a disengaging means for providing an opening therebetween.

11. The in-line sputtering system of claim 10, wherein the disengaging means has a wheel assembly.

12. A method for depositing a thin film on a substrate by using the in-line sputtering system of claim 9, comprising the steps of:
    moving the substrate in the entry transfer module faster than the substrate in the first sputtering module; and
    moving the substrate in the first sputtering module while it is coated with the thin film.

* * * * *